US006788061B1

(12) United States Patent
Sweedler et al.

(10) Patent No.: US 6,788,061 B1
(45) Date of Patent: *Sep. 7, 2004

(54) MICROCOIL BASED MICRO-NMR SPECTROMETER AND METHOD

(75) Inventors: Jonathan V. Sweedler, Urbana, IL (US); Richard L. Magin, Urbana, IL (US); Timothy L. Peck, Champaign, IL (US); Andrew G. Webb, Urbana, IL (US)

(73) Assignee: The Board of Trustees of the University of Illinois, Champaign-Urbana, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/252,655

(22) Filed: Sep. 23, 2002

Related U.S. Application Data

(63) Continuation of application No. 09/629,685, filed on Aug. 1, 2000, now abandoned.

(51) Int. Cl.$^7$ .................................................. G01V 3/00
(52) U.S. Cl. ....................... 324/321; 324/318; 324/322
(58) Field of Search ................................ 324/321, 318, 324/322, 300, 307, 309

(56) References Cited

U.S. PATENT DOCUMENTS

| | | | |
|---|---|---|---|
| 5,092,973 A | | 3/1992 | Zare et al. |
| 5,141,609 A | | 8/1992 | Sweedler et al. |
| 5,283,036 A | | 2/1994 | Hofmann et al. |
| 5,654,636 A | * | 8/1997 | Sweedler et al. ........... 324/321 |
| 6,097,188 A | | 8/2000 | Sweedler et al. |
| 6,307,372 B1 | * | 10/2001 | Sugarman et al. .......... 324/321 |

OTHER PUBLICATIONS

A new microcell design for use with large volume NMR tubes. Application for low natural abundance isotopes studied by NMR by J.D. Cargioli and E.A. Williams; American Institute of Physics; pp. 1263–1264, May 23, 1974.

Cho et al., "Nuclear magnetic resonance microscopy with 4–$\mu$m resolution: Theoretical study and experimental results," *Med. Phys.* 15(6):815, 1988.

Sanny et al., "Microwave electron spin resonance spectrometer with operation to 54 mK in a diliution refrigerator," *Rev. Sci. Instrum.* 52(4):539, 1981.

Mahdjour et al., "High–sensitivity broadband microwave spectroscopy with small nonresonant coils," *Rev. Sci. Instrum.* 57(6):1100, 1986.

* cited by examiner

*Primary Examiner*—Louis Arana
(74) *Attorney, Agent, or Firm*—Woodard, Emhardt, Moriarty, McNett & Henry LLP

(57) ABSTRACT

The present invention provides and NMR apparatus comprising an analyte sample holder having a containment region that holds a volume of less than about 1 microliters of the analyte sample, a coil, which encloses the containment region of the analyte sample holder and the analyte sample contained therein, the coil operatively associated with the analyte sample contained in the containment region of the analyte sample holder such that the coil can transmit and/or receive energy from the analyte sample in the containment region of the analyte sample holder, and a magnet to provide a static magnetic field in which the coil and the analyte sample in the containment region of the analyte sample holder are located, wherein the coil and the magnet provide for the obtainment of an NMR spectrum having a spectral line width resolution of less than about 0.1 parts per million.

18 Claims, 5 Drawing Sheets

Experimental set-up for ¹HNMR-LC

MICROCOIL BASED MICRO-NMR SPECTROMETER AND METHOD

This application is a continuation of Ser. No. 09/629,685 filed Aug. 1, 2000, now abandoned

GOVERNMENT RIGHTS

This invention was made with Government support under Contract Number CHE-9257024 and DIR-912419-2225 awarded by the National Science Foundation. The Government has certain rights in the invention.

FIELD OF THE INVENTION

This invention relates to an apparatus and method for the structural elucidation and determination of small volumes of an analyte. More particularly, this invention relates to an apparatus and method for the structural elucidation and determination of analytes in nanoliter volume samples using a micro-nuclear magnetic resonance spectrometer ($\mu$NMR).

BACKGROUND OF THE INVENTION

Nuclear magnetic resonance spectroscopy, or NMR, is one of the most powerful and commonly used methods for the analysis and elucidation of the chemical structure of molecules. However, NMR suffers from an inherently low sensitivity. This low sensitivity is of particular concern when examining small sample volumes (<1 ml), where the dependence of the NMR signal strength on sample volume results in an enormous reduction in the signal-to-noise ratio (SNR). A poor SNR is a fundamental limitation of NMR microspectroscopy. Conventional NMR spectrometers use radio frequency coils ranging from several millimeters to tens of centimeters in diameter to tightly couple to sample volumes that range from several microliters to greater than 1 liter. In addition, NMR spectroscopy requires that the high strength static magnetic field ($B_0$) into which the sample is immersed be highly homogeneous (<1 ppm over then entire volume of the sample) and necessitates the use of physically large, highly sophisticated, expensive superconducting magnets. Although recent advancements in high-field magnet technology have provided higher strength magnetic fields with improved homogeneity, the costly purchase price of these large magnets has precluded the development of customized NMR systems.

The radiofrequency (RF) coil used to receive the free-induction decay signal from the sample is a key component of the NMR spectrometer and has a profound effect on the observed SNR. In general, the RF coil can be used both to transmit energy to the sample thereby exciting the sample from its equilibrium state to its excited state, and to receive energy from the sample as it relaxes from its excited state to its equilibrium state. To optimize the detection efficiency, high performance coils with low resistivity and high inductance are designed to tightly couple to the sample and to present a highly homogeneous RF magnetic field to the sample. Although the vast majority of conventional NMR spectrometers use relatively large RF coils (mm to cm size) and samples in the $\mu$l to ml volume range, there are significant performance advantages achieved by using smaller size coils when examining very small samples.

Unlike larger systems, where the dominant source of noise is the conducting sample, the primary noise in NMR spectroscopy of small samples is the thermal noise (also called the Johnson noise) of the RF coil. For example, when considering samples with conductivities similar to that of biological tissue (i.e., saline) and static magnetic field strengths of several Tesla, the transition from sample dominated noise to coil dominated noise occurs at a size scale of several millimeters. As the detection sensitivity of the RF coil increases inversely with coil diameter and the variation in coil resistance with coil size is less pronounced, the mass (detection) sensitivity of the system is enhanced at smaller dimensions. This has been the justification of several studies using microcoils to examine mass-limited or volume-limited samples. However, in all previous work, these coils have been used in conventional (large) NMR magnets and with conventional NMR spectrometers, and thus one Of the most significant advantages of microcoils has not been realized.

SUMMARY OF THE INVENTION

The present invention relates to $\mu$NMR spectrometers using miniaturized and customized NMR magnets tailored to the smaller sizes and applications of micron to millimeter sized RF microcoils. By restricting the size of the sample to microscopic domain applications, the required volume over which the static magnetic field must be uniform is relaxed by several orders of magnitude. In addition, the working distance required between the pole faces (or opposing coils) of the magnet is significantly reduced when compared with conventional NMR systems. Consequently, when considering a microcoil-based, dedicated NMR spectrometer for investigations of mass and/or volume limited samples, and applications, that require reduced-scale geometries (e.g., capillary electrophoresis), the physical size of the magnet can be greatly reduced and the homogeneity constraints (i.e., the volume over which the magnetic field must be uniform) are significantly relaxed. An additional advantage of using a smaller magnet is that space allocation restrictions (due primarily to the stray magnetic lines of force that extend outside the magnet) are significantly reduced without the need of elaborate self-shielding designs.

Although the static field magnet represents the single most substantial contribution to the cost of the system, a $\mu$NMR spectrometer specifically tailored to microdomain applications would benefit from reduced cost in other system components as well, (e.g., the RF power amplifier). The greatly reduced cost of such a system would make possible the acquisition of $\mu$NMR spectrometers by research and educational groups interested in a narrower range of NMR applications, and consequently, the complexity of the computer and data acquisition components can be reduced to include a subset of available pulse sequences and detection and reconstruction algorithms deemed appropriate for the specific application and optimized for experimental conditions. Hence, chip-based (e.g., erasable programmable read only memory, EPROM) modules can be used to replace larger, more comprehensive front-end computer and data acquisition systems currently used in conventional NMR spectrometers, and would result in further cost reduction, potentially with an increase in performance for the specific application. Physician's offices, educational classrooms, chemistry laboratories, and research and manufacturing sites where delicate or fragile products cannot be transported (e.g., a semiconductor manufacturing clean-room) are but a few of the locations where a low-cost, tabletop $\mu$NMR spectrometer can be advantageous.

Finally, the reduced size of the $\mu$NMR spectrometer provides a unique aspect of modularity. A natural extension of this aspect of the invention is to use NMR detection in conjunction with other investigative modalities and instrumentation (e.g., cell flow cytometry) as an add-on module. Although other detection schemes (e.g., laser-induced florescence) have previously been used in such capacities, the cost and size of NMR spectrometers have precluded the use of NMR in such applications.

Thus, the major advantages of the present μNMR instrument include, but are not limited to, smaller size, lower cost, higher mass sensitivity compared to conventional NMR, and the ability to tailor such instruments to a particular application such as microseparations for even further improvement in performance and modularity, specifically to provide NMR detection and analysis capabilities to complement other more traditional detection modalities on existing research and analytical instrumentation.

Specifically, the present invention provides an NMR apparatus for analyzing and elucidating the chemical structure of an analyte sample, the apparatus comprising an analyte sample holder having a containment region that holds a volume of less than about 10 microliters of the analyte sample, a microcoil, which encloses the containment region of the analyte sample holder and the analyte sample contained therein, the microcoil having an inside dimension of less than about 1 mm, and the microcoil operatively associated with the analyte sample contained in the containment region of the analyte sample holder such that the microcoil can transmit and/or receive energy from the analyte sample in the containment region of the analyte sample holder, and a magnet having a mass less than about 50 kg, the magnet positioned about the microcoil and the analyte sample in the containment region of the analyte sample holder to provide a static magnetic field in which the microcoil and the analyte sample in the containment region of the analyte sample holder are located, wherein the microcoil and the magnet provide for the obtainment of an NMR spectrum of the analyte sample in the containment region of the analyte sample holder having a spectral line width resolution of less than about 0.1 parts per million.

The present invention also provides a method of analysis and elucidation of the chemical structure of an analyte using NMR, the method comprising providing an analyte sample that has a volume of less than about 10 microliters, enclosing the analyte sample in a microcoil wherein the inside dimension of the microcoil is less than about 1 mm, generating a static magnetic field about the analyte sample using a magnet where the mass of the magnet is less than about 50 kg, transmitting energy to the analyte sample to excite the sample from its equilibrium state to its excited state, detecting the energy emitted from the analyte sample when the sample relaxes from its excited state to its equilibrium state, and transforming the detected energy into a NMR spectrum having a spectral line width resolution of less than about 0.1 parts per million.

DESCRIPTION OF THE PREFERRED EMBODIMENTS

The present invention provides an NMR apparatus for analyzing and elucidating the chemical structure of an analyte sample, the apparatus comprising an analyte sample holder having a containment region that holds a volume of less than about 10 microliters of the analyte sample; a microcoil, which encloses the containment region of the analyte sample holder and the analyte sample contained therein, the microcoil having an inside dimension of less than about 1 mm, and the microcoil operatively associated with the analyte sample contained in the containment region of the analyte sample holder such that the microcoil can transmit and/or receive energy from the analyte sample in the containment region of the analyte sample holder; and a magnet having a mass less than about 50 kg, the magnet generating a static magnetic field about the analyte sample in the containment region of the analyte sample holder, wherein the microcoil and the magnet provide for the obtainment of an NMR spectrum of the analyte sample in the containment region of the analyte sample holder having a spectral line width of less than about 0.1 parts per million.

Figure 1:
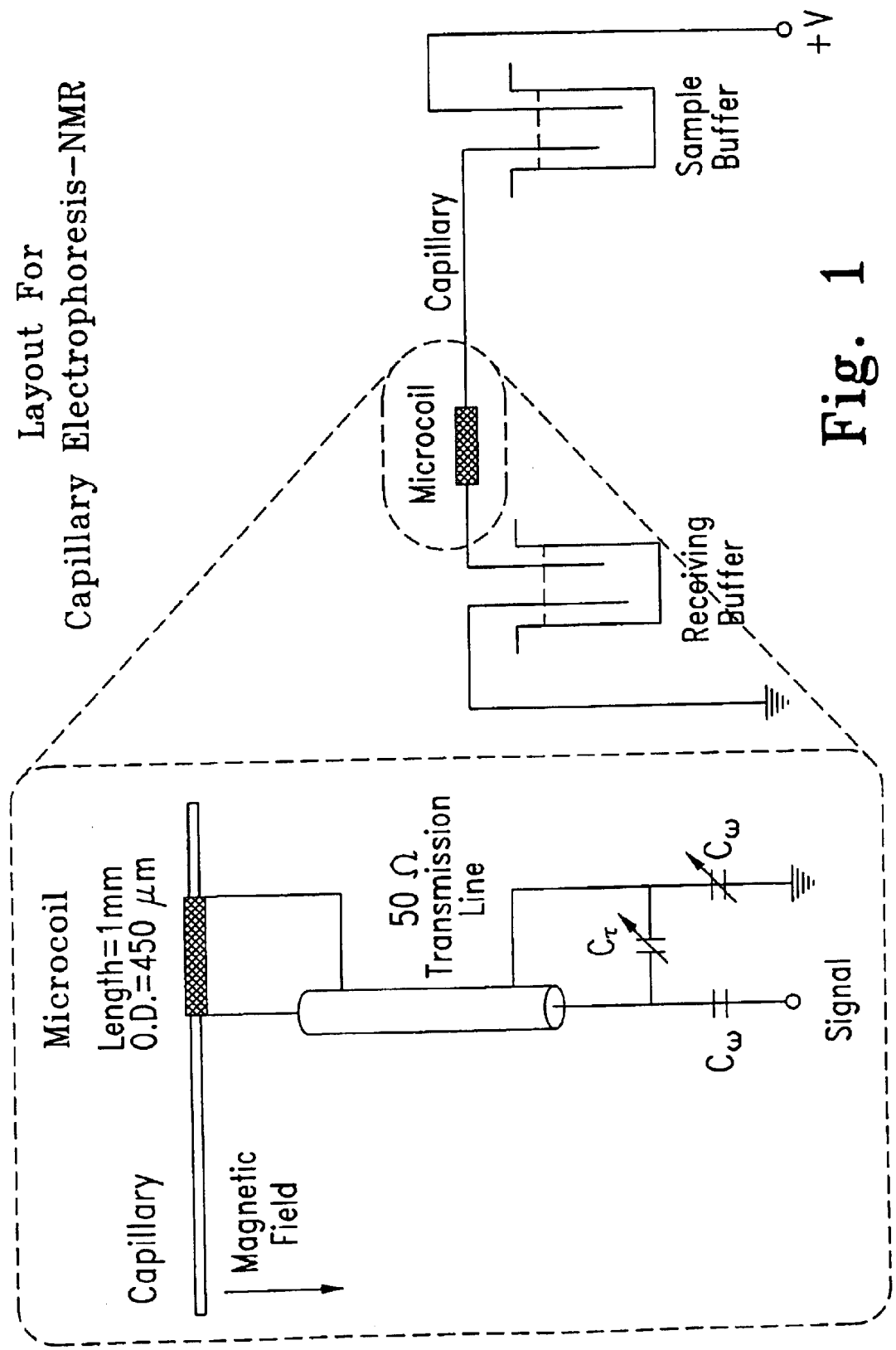
FIG. 1 is a schematic view of a microcoil based NMR used to detect analytes in a capillary electrophoresis system.

FIG. 1 shows a microcoil based NMR detector circuit which can be used to detect analytes during capillary electrophoresis. The region including the microcoil is expanded at the right of FIG. 1. This expanded region shows a microcoil that is wrapped or wound around a capillary, which acts as the sample holder. In FIG. 1, the region of the sample holder that is enclosed by the microcoil is the containment region. FIG. 1 also shows the polarity of the static magnetic field generated by a magnet.

A key component of the present invention is the microcoil. In NMR spectroscopy, the magnitude of the signal detected by an RF coil is directly proportional to the volume of the sample and the sensitivity of the RF coil. Conventional NMR studies involve sample volumes of 0.01 ml or larger using RF coils that range in size from several millimeters to nearly 1 meter in diameter. Smaller RF coils possess a greater sensitivity than do larger coils for free induction decay (FID) detection from smaller samples, and thus, provide a higher sensitivity and SNR. In the present invention the RF coil is an RF microcoil having an inside dimension of less than about 1 mm. It is also preferable that the coil's total length is less than 1 mm. The microcoil may be composed of those coils known in the art. For example, the microcoil may be a multi-turn solenoid, which may be directly wound on the sample holder. Alternatively, the microcoil can be formed first and the sample holder introduced into the microcoil. In general, the microcoil must surround or encompass the analyte contained in the sample holder. As used herein, the term "analyte" shall mean a compound or mixture of compounds for which it is desired to generate an NMR spectrum.

Typically, the analyte is dissolved or suspended in a solution. Other geometries and winding configurations can be used including, but not limited to, saddle coils, surface coils, birdcage coils and coil arrays. The microcoil can also be a planar, potentially multi-layer, multi-turn, for example, lithographic coil. It is, however, important that the microcoil provide for the desired SNR and spectral resolution with minimal susceptibility induced distortion of the static magnetic field generated by the magnet. A preferred microcoil is made from cop per or various copper alloys chosen to minimize susceptibility-induced line broadening.

The present invention also comprises an analyte sample holder having a containment region that holds a volume of less than about 10 microliters of the analyte sample. In general, the microcoil encompasses the containment region. The sample holder may be a capillary, which can be formed from many different materials. In selecting a sample holder, the material from which the sample holder is constructed should not detrimentally interact with the analyte or interfere with the operation of the microcoil or the magnet. A preferred sample holder is a capillary. The capillary is preferably formed from fused silica (or glass) and has an inside dimension in the containment region of between 50 and 1000 μm. Preferably, the shape of the capillary is cylindrical; however, other geometric shapes may also be used in the present invention.

In a preferred embodiment, the microcoil is wrapped about the outside surface of the capillary, and thus, the capillary serves as both the sample holder and the coil form. In another embodiment of the invention, the sample holder can be formed from a substrate which has one or more channels or grooves. This substrate can then serve as the analyte sample holder. The channels or grooves may be introduced in the substrate by etching or the like and the sample may be contained in the channels or groves.

Also shown in the expanded region of FIG. 1 is an electrical circuit, which is in operable association with the microcoil to transmit to and receive energy from the analyte sample in the containment region of the analyte sample holder. It should be noted that FIG. 1 shows a single microcoil, which may be used to transmit to and receive energy from the sample. However, in another embodiment of the invention, more than one microcoil may be used. For example, in one embodiment, one microcoil or larger RF coil may be used to transmit energy to the sample and a second microcoil may be used to receive energy from the sample.

The detection circuit typically includes impedance matching network components that are made out of materials that are designed to minimize susceptibility induced line broadening in the NMR spectrum by minimizing the static magnetic field distortions. In addition, the electrical circuit transmits the detected energy from the sample and introduces the energy to a processor, which analyzes and graphically displays the detected energy as a time or frequency domain the NMR spectrum. The types of circuits and processors that accomplish this are well known to those skilled in the art, and many variations can be used in connection with the present invention depending on the desired applications and types of NMR spectra desired. Such processors may include computers and any associated software, which are also known in the art. An exemplary computer for this application is an Apple Macintosh with MacNMR software, available from Tecmag Corporation of Houston, Tex.

In general, the microcoil is physically separated from the electrical circuit, although the two are electrically connected. Separation of the microcoil and the analyte from the components of the electrical circuit tends to minimize the susceptibility induced distortions of the static magnetic field in the containment region of the sample. It is to be understood that other arrangements for matching the impedance and reducing local distortions can be used in the present invention and that electrical performance and SNR advantages may be obtained using these other configurations known to those skilled in the art. For example, the impedance matching elements can be positioned immediately adjacent to the microcoil and a transmission line may not be used to separate the microcoil and the impedance matching elements.

Figure 2:
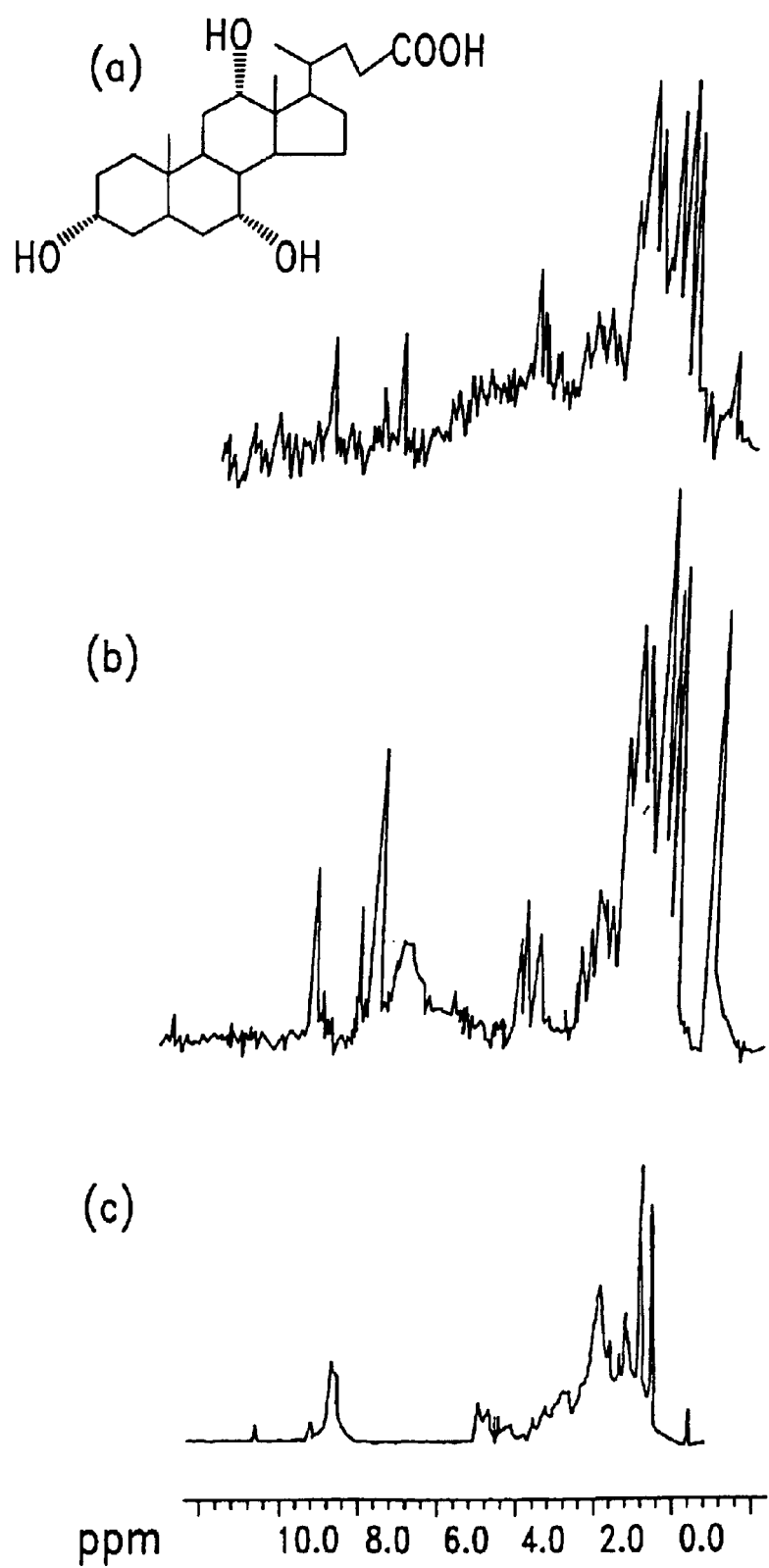
FIGS. 2(a–c) show NMR spectra of cholic acid obtained using a microcoil based NMR and a conventional NMR.

FIG. 2 shows NMR spectra of 50 mM cholic acid in $D_2O$ (analytical grade, Sigma, St. Louis, Mo.) obtained using a GN-300(7.05T)/89 mm NMR spectrometer using MacNMR software. Instead of the conventional coils, however, the spectrometer used a microcoil and the volume of analyte sample in the containment region of the sample holder was either 5 and 50 nl.

FIG. 2(a) shows a spectrum produced from 512 coadded scans from a 5 nl sample. The microcoil had a inside dimension of 75 microns and an outside dimension of 355 microns. The length of the microcoil was 1 mm.

FIG. 2(b) shows a NMR spectrum of 128 coadded scans from a 50 nl volume analyte sample in the containment region. The microcoil had a inside dimension of 250 microns and an outside dimension of 355 microns. The length of the microcoil was 1 mm.

For comparison, a large volume commercial sample NMR spectrum was prepared. FIG. 2(c) shows the NMR spectrum obtained from A 70 mM cholic acid solution in a 0.5 ml commercial NMR tube with 4 coadded scans using a conventional RF coil.

Figure 3:
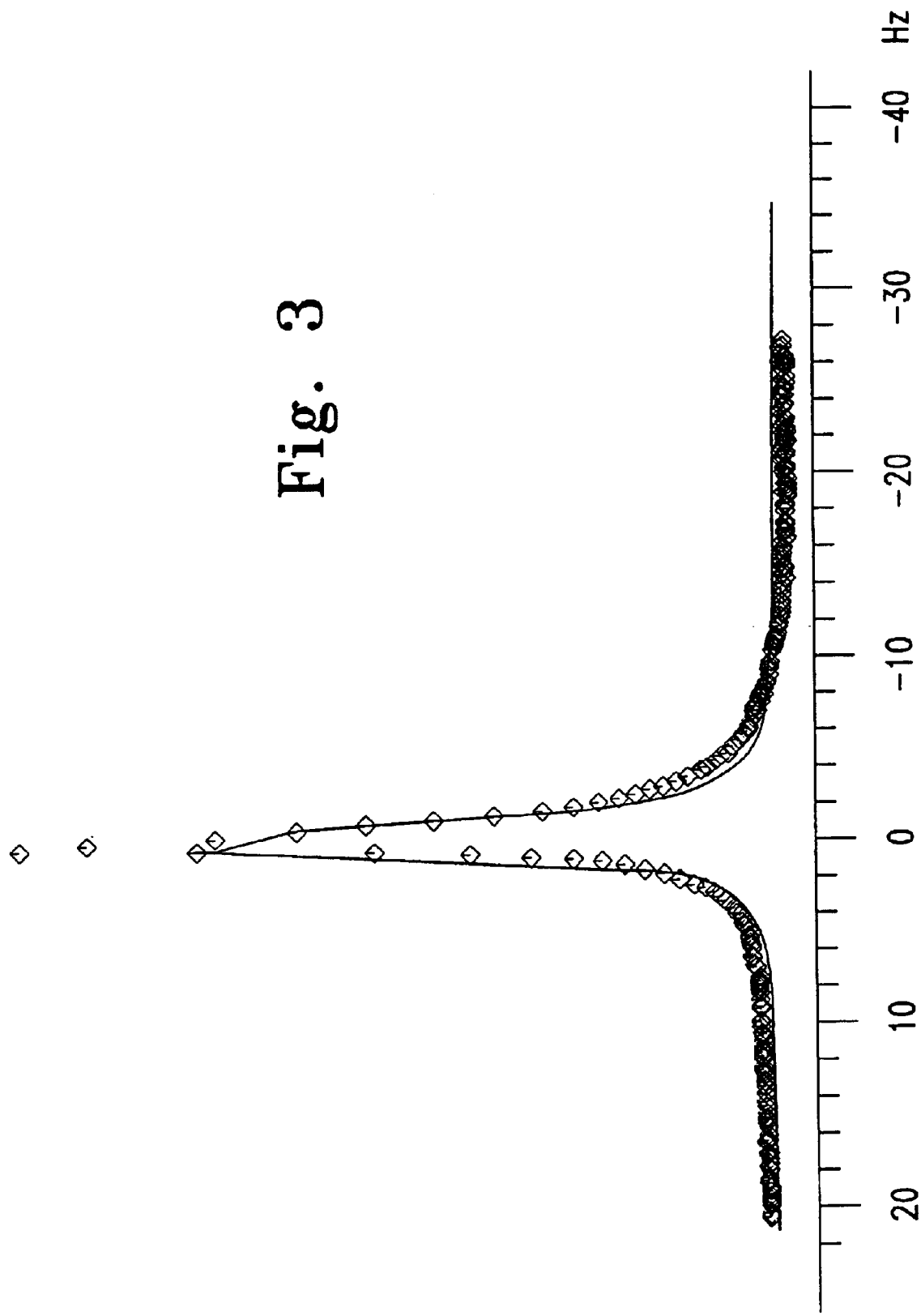
FIG. 3 shows a portion of a NMR spectrum, which demonstrates that 2 Hz linewidth resolution can be obtained using a microcoil based NMR.

These spectra indicate the sensitivity enhancement provided by the microcoil when nanoliter volume samples were used. Moreover, 2 Hz linewidths are obtainable from a sample of $H_2O$ when the microcoil is uniformly wrapped and the magnetic field is carefully shimmed. FIG. 3 shows a NMR spectra demonstrating that 2 Hz linewidth resolution is obtainable with the present invention. Thus, a NMR based on a microcoil provides improved mass sensitivity with the spectral resolution necessary to resolve scalar coupling and to perform sophisticated NMR methods such as Nuclear Overhauser Enhanced Spectroscopy (NOESY) and other techniques known to those skilled in the art.

Another important component of the present invention is magnet having a mass of less than about 50 kg. The magnet generates a static magnetic field about the analyte sample in the containment region of the analyte sample holder. In other words, the microcoil and the analyte sample in the containment region of the sample holder are located within a static, homogeneous magnetic field. In a preferred embodiment, the magnet has a maximum dimension of less than about 90 cm.

The magnets generally are high strength superconducting magnets, although other magnets (e.g., permanent or resistive) may be used. Superconducting magnets require a cryostat system for cooling the magnets to the temperature required. Therefore, conventional NMR magnets are very large and expensive. However, the present invention uses much smaller magnets, which can have a less uniform magnetic field than the conventional magnets used in NMR.

Figure 4:
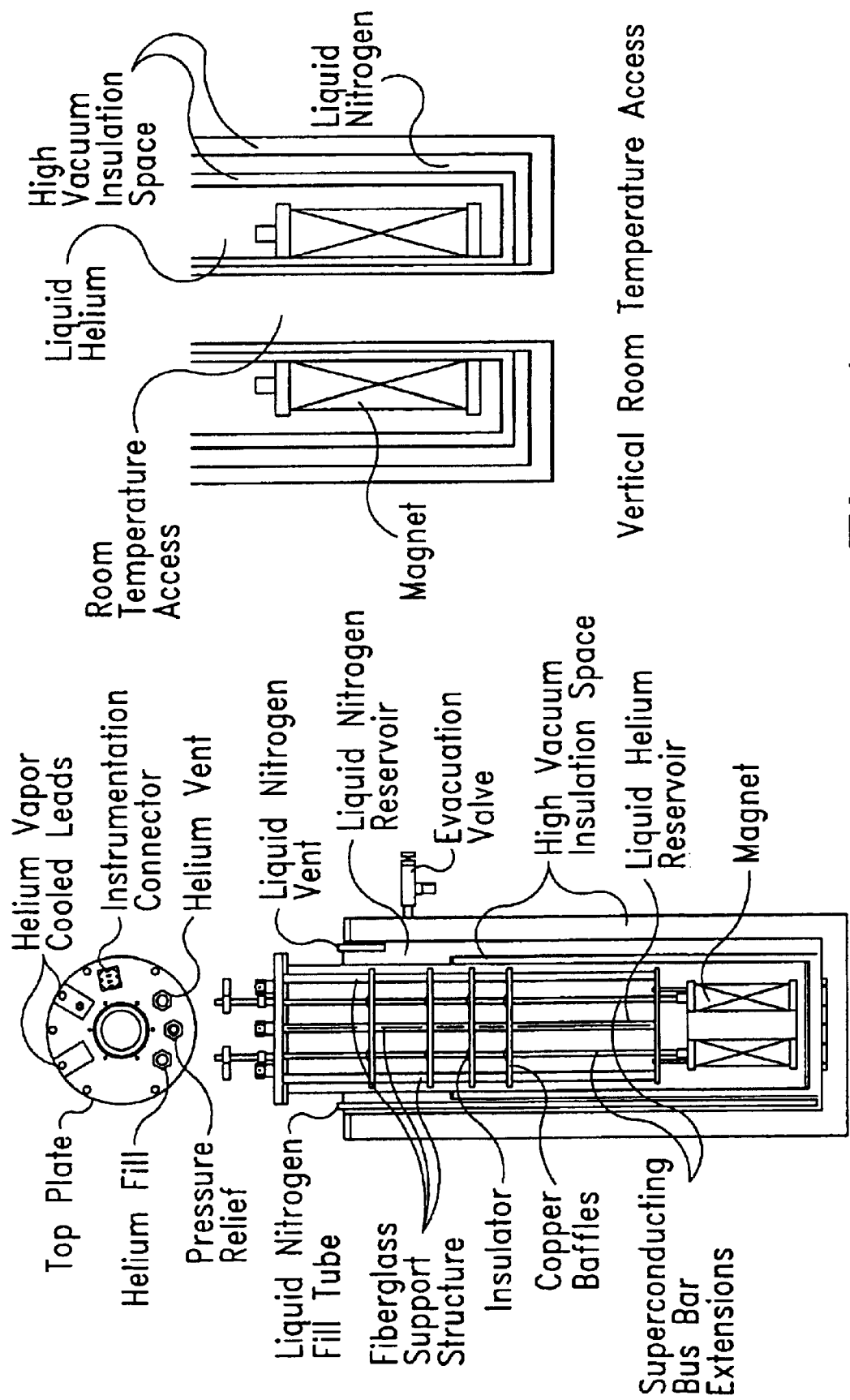
FIG. 4 is a schematic view of an NMR spectrometer and magnet assembly that contains a microcoil.

In one embodiment of the present invention, a μNMR is provided which uses a 9 Telsa superconducting magnet commercially available from American Magnetics (Oak Ridge, Tenn.), although this magnet was not specifically designed for this system. Such a magnet is shown in FIG. 4. The magnetic field uniformities for this particular superconducting solenoid (dimensions of 4.1 by 7.2 inches with a 1.5 inch bore) are listed in Table 1, with the magnetic field specification provided by American Magnetics.

TABLE I

Theoretical performance of a commercially available small 9 Tesla superconducting magnet in terms of linewidth broadening from magnetic field inhomogeneities.

| | Bz | Bmod | (Bmod-Bo)/Bo | Minimum Linewidth (Hz) |
|---|---|---|---|---|
| Sample Length (μm) Axial Direction | | | | |
| 0 | 90000.000 | 90000.000 | 0 | 0 |
| 40 | 89999.9987 | 89999.9987 | $-1.43 \times 10^{-8}$ | 5 |
| 80 | 89999.9948 | 89999.9948 | $-5.72 \times 10^{-8}$ | 22 |
| 120 | 89999.9884 | 89999.9884 | $-1.29 \times 10^{-7}$ | 49 |

TABLE I-continued

Theoretical performance of a commercially available small 9 Tesla superconducting magnet in terms of linewidth broadening from magnetic field inhomogeneities.

| Sample Width (μm) Radial Direction | Bz | Bmod | (Bmod-Bo)/Bo | Minimum Linewidth (Hz) |
|---|---|---|---|---|
| 0 | 90000 | 90000 | 0 | 0 |
| 40 | 90000.0064 | 90000.0064 | $7.08 \times 10^{-8}$ | 27 |
| 80 | 90000.0083 | 90000.0083 | $9.23 \times 10^{-8}$ | 36 |
| 120 | 90000.0115 | 90000.0115 | $1.28 \times 10^{-7}$ | 49 |

The uniformity specifications in Table 1 indicate that a presently available magnet, which has not been specifically designed for this application, can be used for NMR for samples with dimensions of less than about 100 microns. This particular magnet has a specified field inhomogeneity of <0.1% over a 1 cm diameter spherical volume at the magnet center. Magnets of the same size and field strength are available with an order of magnitude higher uniformity over the central 1 cm (<0.01%) at less than 10% increased systems cost. In addition, these minimum linewidths can be reduced by spinning or moving the analyte sample as in a conventional system. This averages the effects of field nonuniformities over the sampling region. Although this magnet is commercially available, it has not been used for high resolution NMR spectroscopy, and in fact, without the development of RF microcoils, such an application is impossible.

Another important magnet performance parameter includes magnetic field drift; for the above-described magnet, the drift is in the $10^{-7}$–$10^{-8}$/hr range, allowing several minute measurements without significant line broadening. Minor corrections for drift are possible using frequency lock circuitry. Other specifications of the embodiment employing the above-described magnet include a 25.4 mm room temperature bore with a vertical liquid helium research dewar made of non-magnetic aluminum with the superconducting solenoid welded in place and enclosed by the dewar. The dimensions of the dewar are approximately 1 m by 0.6 m as the dewar is designed to hold 35 liters of liquid helium and 45 liters of liquid nitrogen. If needed, smaller dewars with shorter cryogen hold times are available with smaller overall system size. The above-described parameters may be varied in accordance with principles known to those skilled in the art.

In addition to the above example, other magnets having the desired properties may be selected by those skilled in the art. Although superconducting magnets are preferred, other magnets may include permanent magnets and electromagnets.

Figure 5:
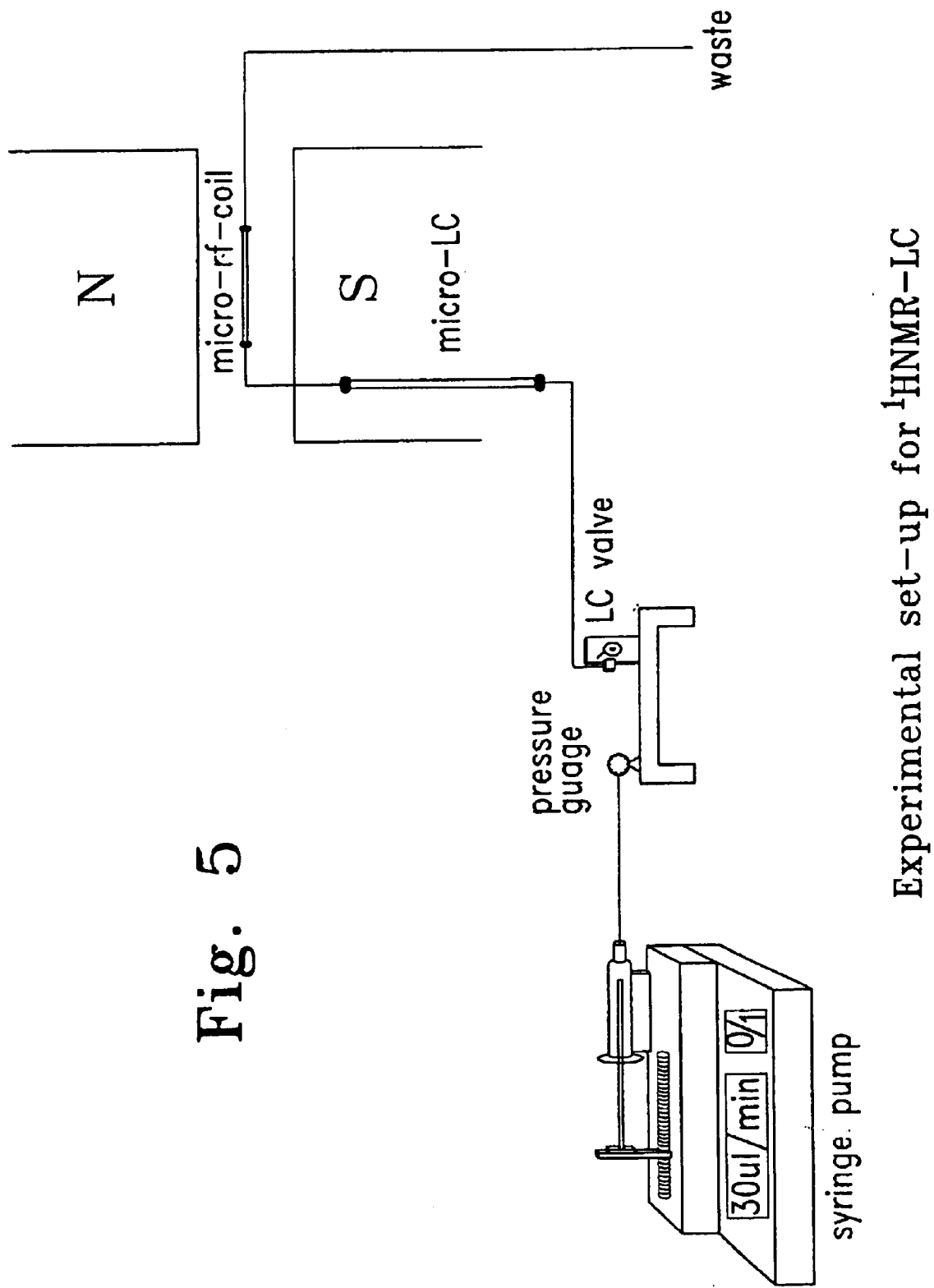
FIG. 5 is a schematic view of a system used for liquid chromatography separation with on-line NMR detection using a superconducting magnet and a microcoil.

One important application of the above described μNMR system is as a desktop system for mass limited static (nonflowing) or on-line measurements. In flowing systems, the NMR may be used, for example, as a detector for liquid chromatography (LC) and capillary electrophoresis (CE). FIG. 5 shows an exemplary LC system, which uses a NMR of the present invention as a detector. Similarly FIG. 1 shows the present invention as a detector in association with a CE system. In order to be practical as a detector for a microseparation system such as LC or CE, the μNMR system should fit on a table top, have a price under $100,000 and be relatively robust. In addition, the NMR must be able to work with samples of less than 5 microliters (preferably in the 0.005–1 microliter size) and have a sensitivity to detect less than microgram amounts in less than a minute. The characteristics of the μNMR described above are ideally suited to this application.

Also provided by the present invention is a method of analysis and elucidation of the chemical structure of an analyte using NMR, the method comprising providing an analyte sample that has a volume of less than about 10 microliters; enclosing the analyte sample in a microcoil wherein the inside dimension of the microcoil is less than about 1 mm; generating a static magnetic field about the analyte sample using a magnet where the mass of the magnet is less than about 50 kg; transmitting energy to the analyte sample to excite the sample from its equilibrium state to its excited state; detecting the energy emitted from the analyte sample when the sample relaxes from its excited state to its equilibrium state; and transforming the detected energy into a NMR spectrum having a spectral line width resolution of less than about 0.1 parts per million.

The sample holder may be part of or connected to a microseparation system such as a LC or CE system. In such systems, the sample holder may comprise a capillary in which a fluid flows continuously where part of the capillary is enclosed by the microcoil of the present invention. The region of the capillary that is enclosed can be called the containment region.

The present invention can be used to obtain the NMR spectra of compounds containing, but not limited to, the following NMR active elements proton ($^{1}$H), carbon-13 ($^{13}$C), fluorine-19 ($^{19}$F), silicon-29 ($^{29}$Si) and phosphorus-31 ($^{31}$p). In general, the present invention may be used to obtain NMR spectra of compounds having any of the NMR active elements know to those skilled in the art.

While the present invention is susceptible to embodiment in various forms, there is shown in the drawings and will hereinafter be described various embodiments, with the understanding that the present disclosure is to be considered as an exemplification of the invention and is not intended to limit the invention to the specific embodiments illustrated.

What is claimed is:

1. An NMR apparatus for analyzing and elucidating the chemical structure of an analyte sample, the apparatus comprising:
   an analyte sample holder having a containment region that holds a volume of less than 1 microliter of the analyte sample;
   a coil operatively associated with the analyte sample contained in the containment region of the analyte sample holder such that the coil can transmit and/or receive energy from the analyte sample in the containment region of the analyte sample holder; and
   a magnet creating a substantially constant magnetic field throughout the containment region of the analyte sample holder;
   wherein the coil and the magnet provide for the obtainment of an NMR spectrum of the analyte sample in the containment region of the analyte sample holder having a spectral line width resolution of less than about 0.1 parts per million.

2. The NMR apparatus of claim 1, wherein the magnet masses less than 50 kg.

3. The NMR apparatus of claim 1, wherein the magnet is a superconducting solenoid, and is positioned about the containment region of the analyte sample holder.

4. The NMR apparatus of claim 1, wherein the coil encloses the containment region of the analyte sample holder.

5. The NMR apparatus of claim 1, wherein the coil is solenoidal.

6. The NMR apparatus of claim 5, wherein the containment region of the analyte sample holder is positioned outside of the solenoidal coil.

7. The NMR apparatus of claim 1, wherein the coil has an inside dimension of less than about 1 mm.

8. The NMR apparatus of claim 1, wherein the containment region holds a volume of less than about 1 $\mu$l of the analyte sample.

9. An NMR apparatus for analyzing and elucidating the chemical structure of an analyte sample, the apparatus comprising:

an analyte sample holder having a containment region with a capacity of less than about 1 microliter;

a coil having an inside dimension of less than about 1 mm, the coil being operatively associated with the analyte sample contained in the containment region of the analyte sample holder such that the coil can transmit and/or receive energy from the analyte sample in the containment region of the analyte sample holder; and a magnet massing less than about 50 kg, the magnet being positioned about the containment region of the analyte sample holder;

wherein the microcoil and the magnet provide for the obtainment of an NMR spectrum of the analyte sample in the containment region of the analyte sample holder having a spectral line width resolution of less than about 0.1 parts per million.

10. A method of analysis and elucidation of the chemical structure on an analyte using NMR, the method comprising:

providing an analyte sample of less than 1 microliter;

providing a coil;

generating a static magnetic field about the analyte sample;

detecting energy emitted from the analyte sample with the coil, and analyzing the detected energy as a time or frequency domain spectrum having a spectral line width resolution of less than about 0.1 parts per million.

11. The method of claim 10, wherein the static magnetic field is generated with a magnet that masses less than 50 kg.

12. The method of claim 10, wherein the static magetic filed is generated with a superconducting solenoid magnet, and that is positioned about the containment region of the analyte sample holder.

13. The method of claim 10, wherein the coil encloses the containment region of the analyte sample holder.

14. The method of claim 10, wherein the coil is solenoidal.

15. The method of claim 14, wherein the containment region of the analyte sample holder is positioned outside of the solenoidal coil.

16. The method of claim 10, wherein the coil has an inside dimension of less than about 1 mm.

17. The method of claim 10, wherein the containment region holds a volume of less than about 1 microliter of the analyte sample.

18. The method of claim 10, wherein the coil, the magnetic field, and a size of the sample are selected such that the principle constraint on the spectral line width resolution is the noise in the coil.

\* \* \* \* \*